(12) United States Patent
Jo et al.

(10) Patent No.: US 8,368,300 B2
(45) Date of Patent: Feb. 5, 2013

(54) LIGHT EMITTING DEVICE, LIGHT EMITTING DEVICE PACKAGE, AND LIGHTING SYSTEM

(75) Inventors: Kyoung Woo Jo, Seoul (KR); Jung Ha Hwang, Seoul (KR); Hyeong Seon Yun, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/910,276

(22) Filed: Oct. 22, 2010

(65) Prior Publication Data

US 2011/0156579 A1 Jun. 30, 2011

(30) Foreign Application Priority Data

Feb. 12, 2009 (KR) .................. 10-2009-0013319
Oct. 23, 2009 (KR) .................. 10-2009-0101228

(51) Int. Cl.
*H01J 1/62* (2006.01)
(52) U.S. Cl. ........................ 313/506; 313/498
(58) Field of Classification Search ........... 313/500–506
See application file for complete search history.

(56) References Cited

U.S. PATENT DOCUMENTS

| 7,683,539 B2 | 3/2010 | Kim et al. |
| 2005/0127385 A1* | 6/2005 | Reeh et al. .................. 257/98 |
| 2006/0261292 A1 | 11/2006 | Kim et al. |

FOREIGN PATENT DOCUMENTS

| CN | 1866561 A | 11/2006 |
| JP | 2004363342 A | 12/2004 |
| JP | 2007306038 A | 11/2007 |

* cited by examiner

*Primary Examiner* — Anh Mai
*Assistant Examiner* — Brenitra M Lee
(74) *Attorney, Agent, or Firm* — McKenna Long & Aldridge LLP

(57) ABSTRACT

Provided are a light emitting device, a light emitting device package, and a lighting system. The light emitting device includes a substrate, a light emitting structure on the substrate, the light emitting structure comprising a first conductive type semiconductor layer, a second conductive type semiconductor layer on the first conductive type semiconductor layer, and an active layer between the first and second conductive type semiconductor layers; a first electrode on the light emitting structure; and a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode.

24 Claims, 10 Drawing Sheets

[FIG. 1]
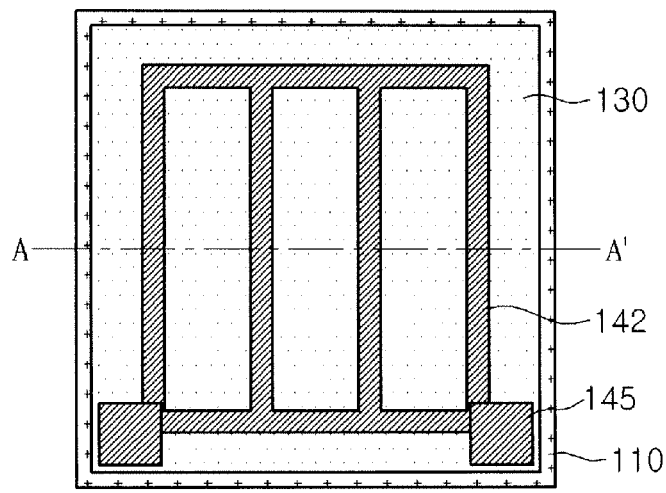
[FIG. 2]
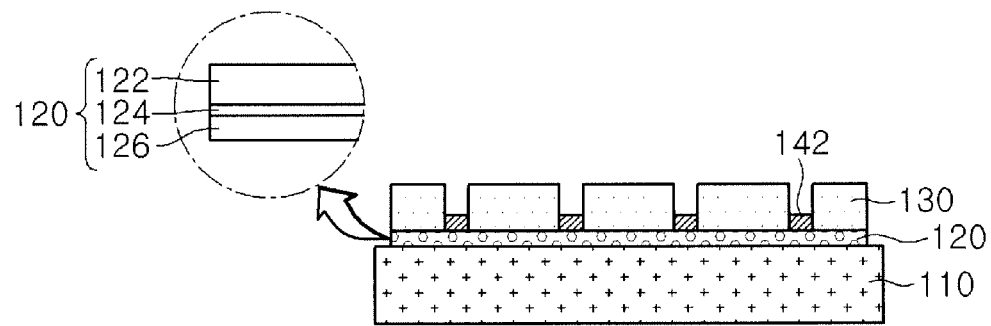

[FIG. 3]
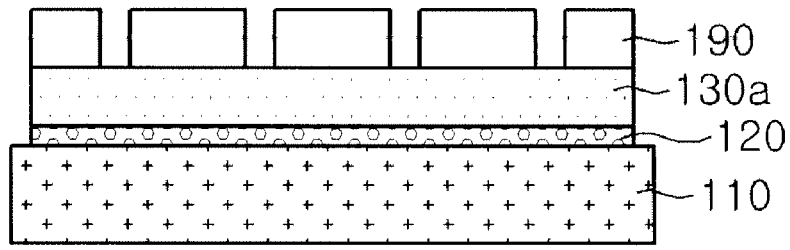
[FIG. 4]
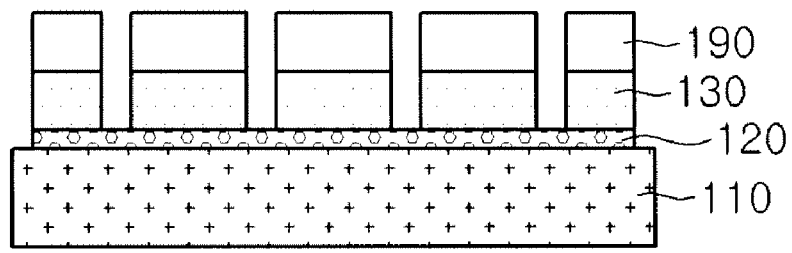
[FIG. 5]
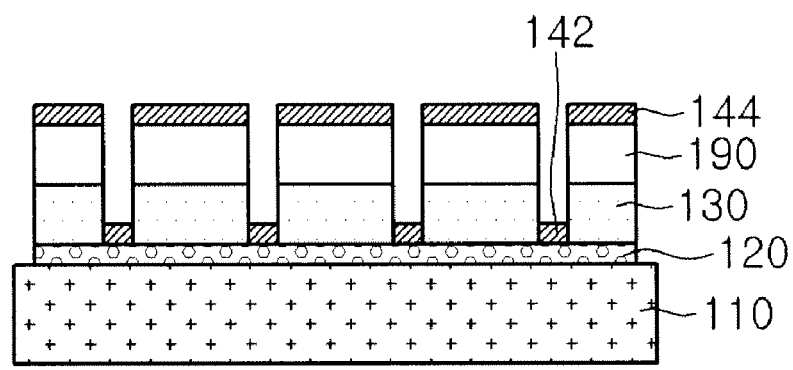
[FIG. 6a]
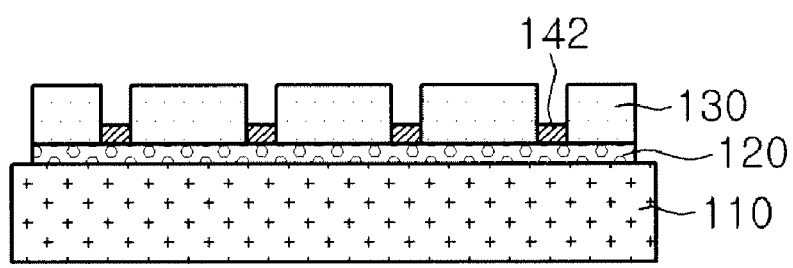

[FIG. 6b]
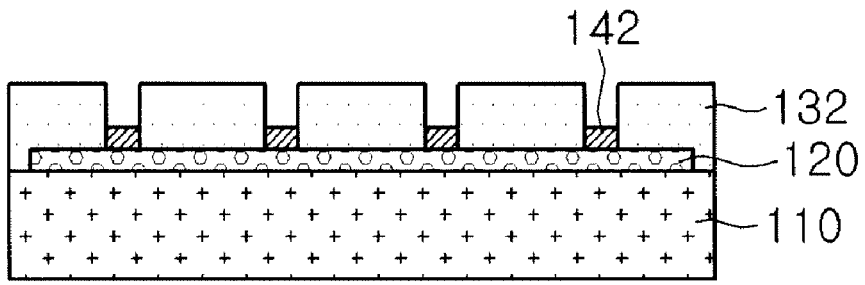
[FIG. 7]
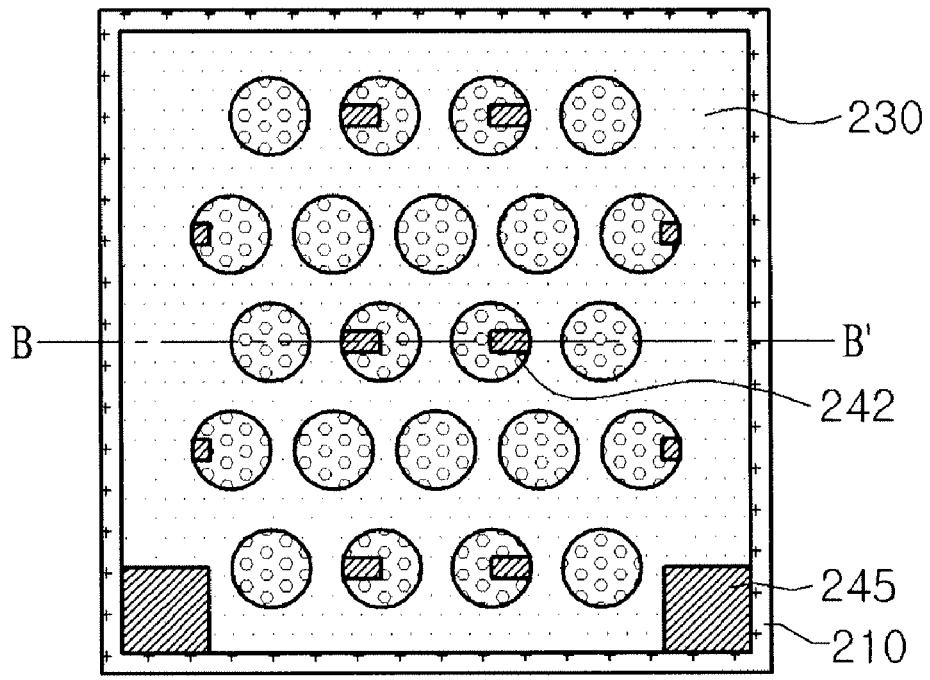
[FIG. 8]
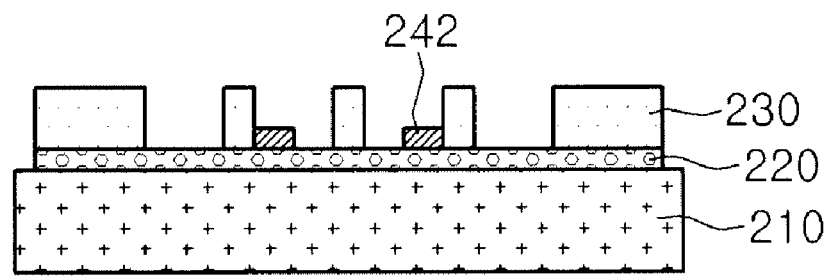

[FIG. 9]
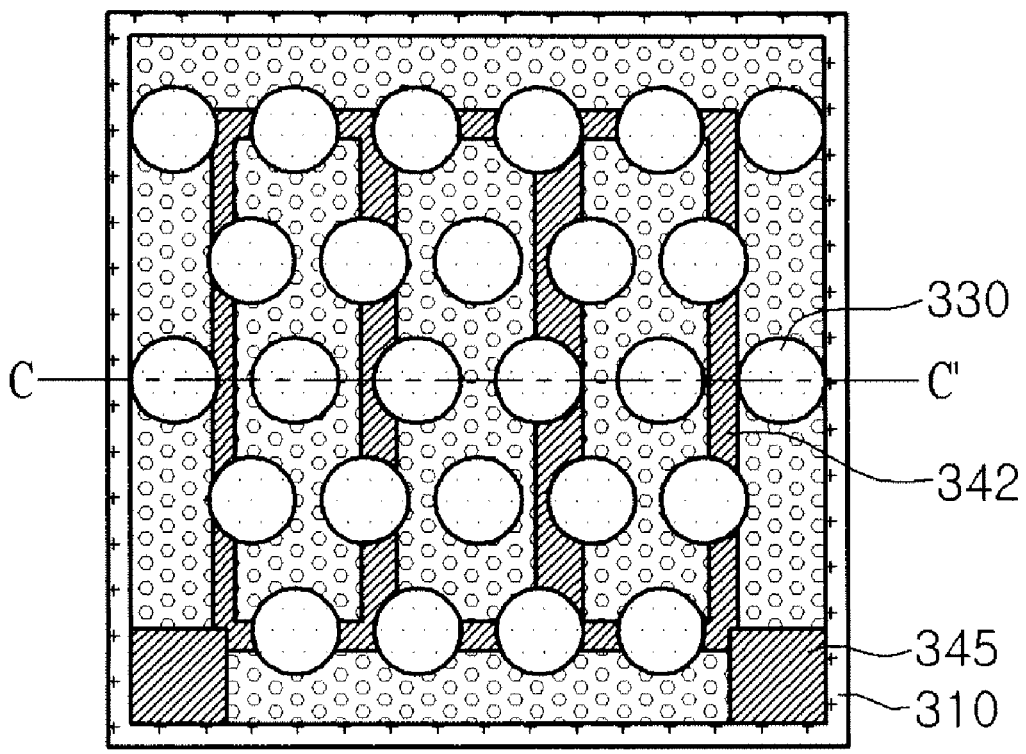
[FIG. 10]
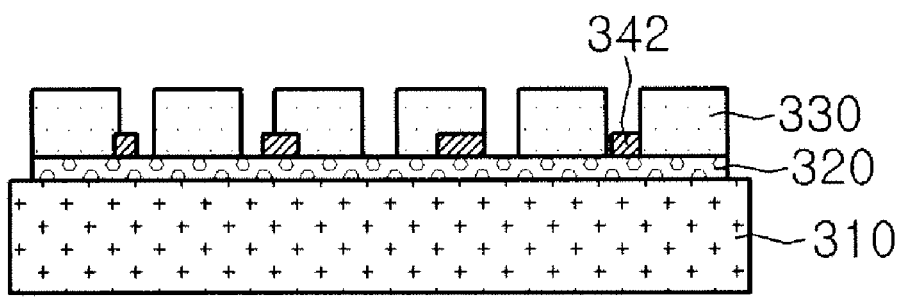

[FIG. 11]
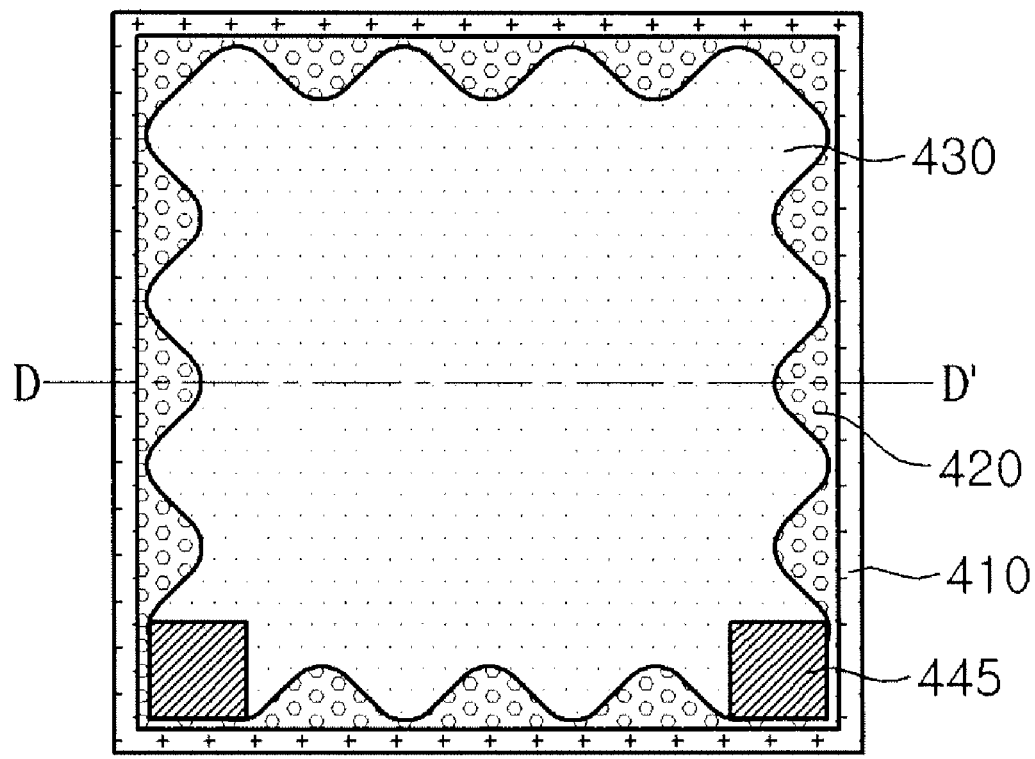
[FIG. 12]
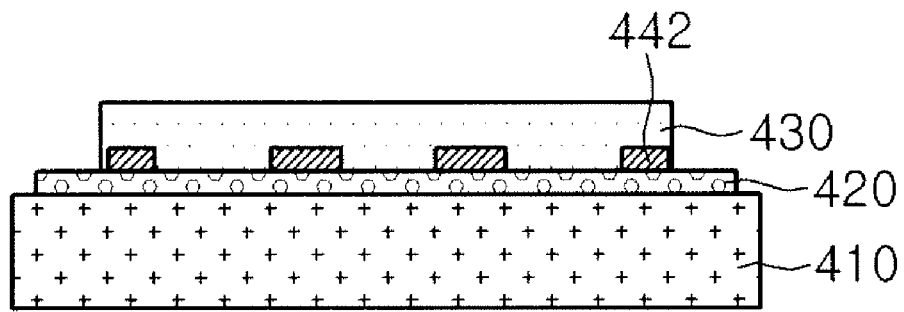

[FIG. 13]
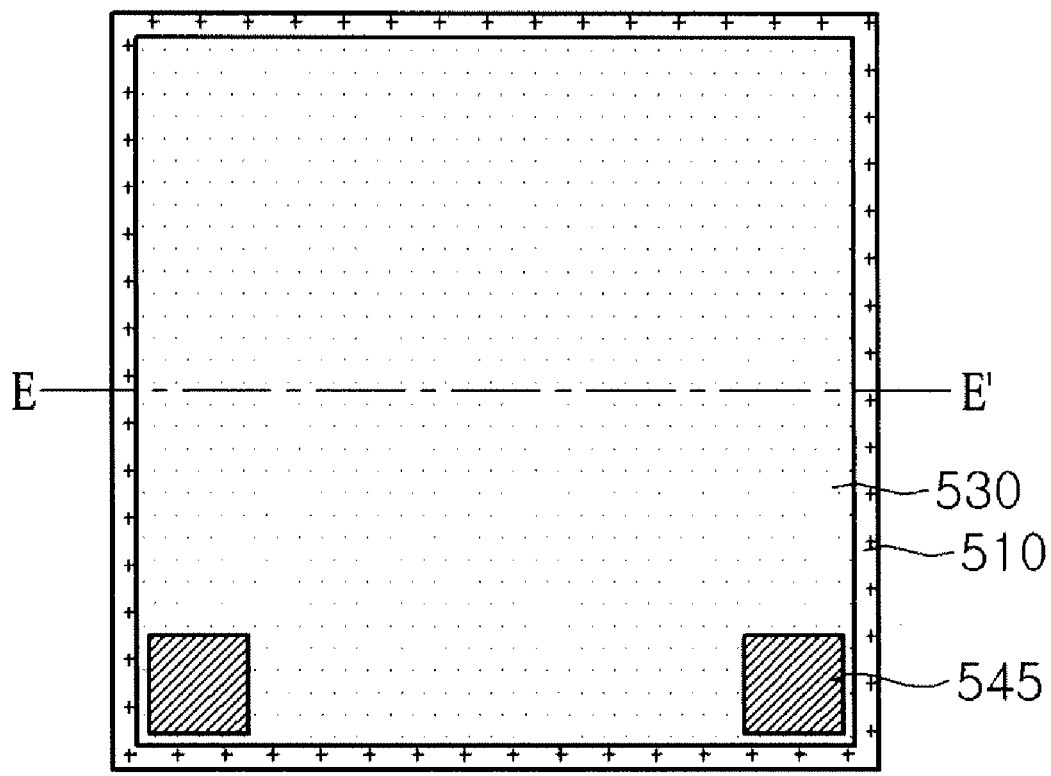
[FIG. 14]
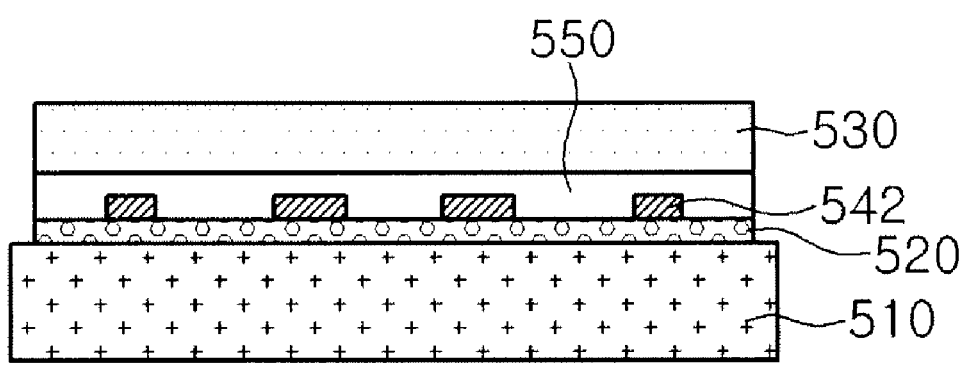

[FIG. 15]
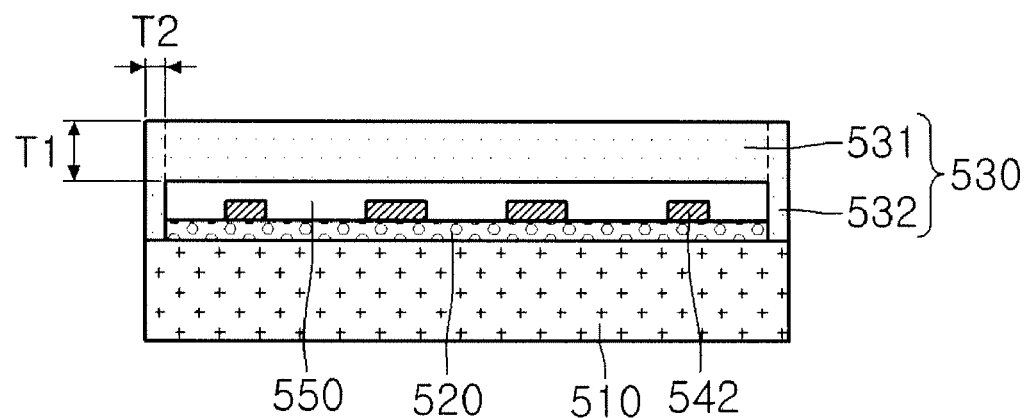
[FIG. 16]
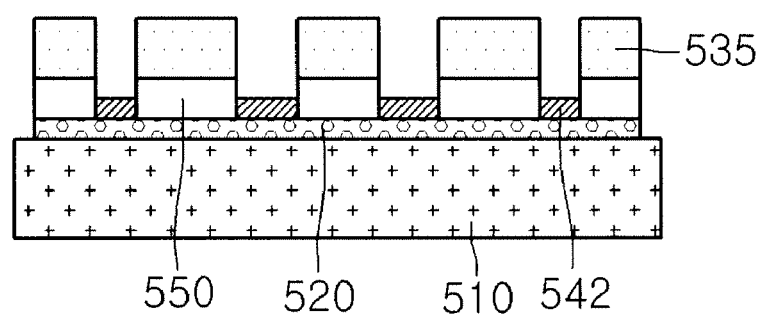

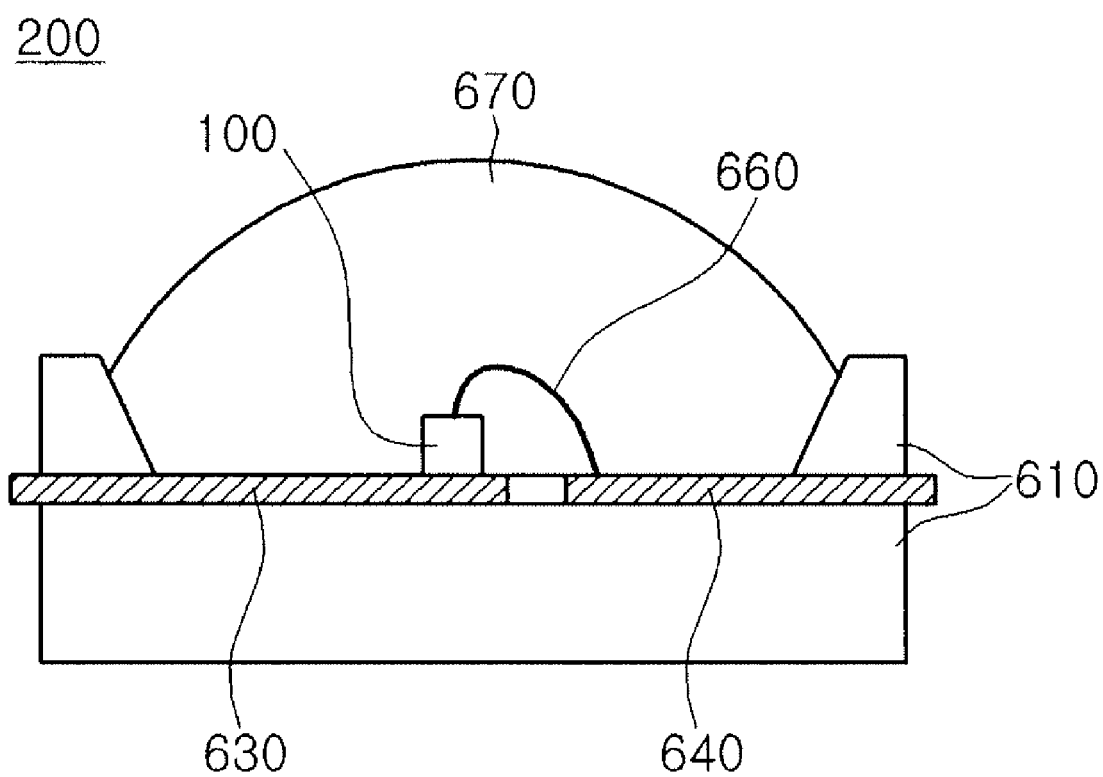
[FIG. 17]

[FIG. 18]
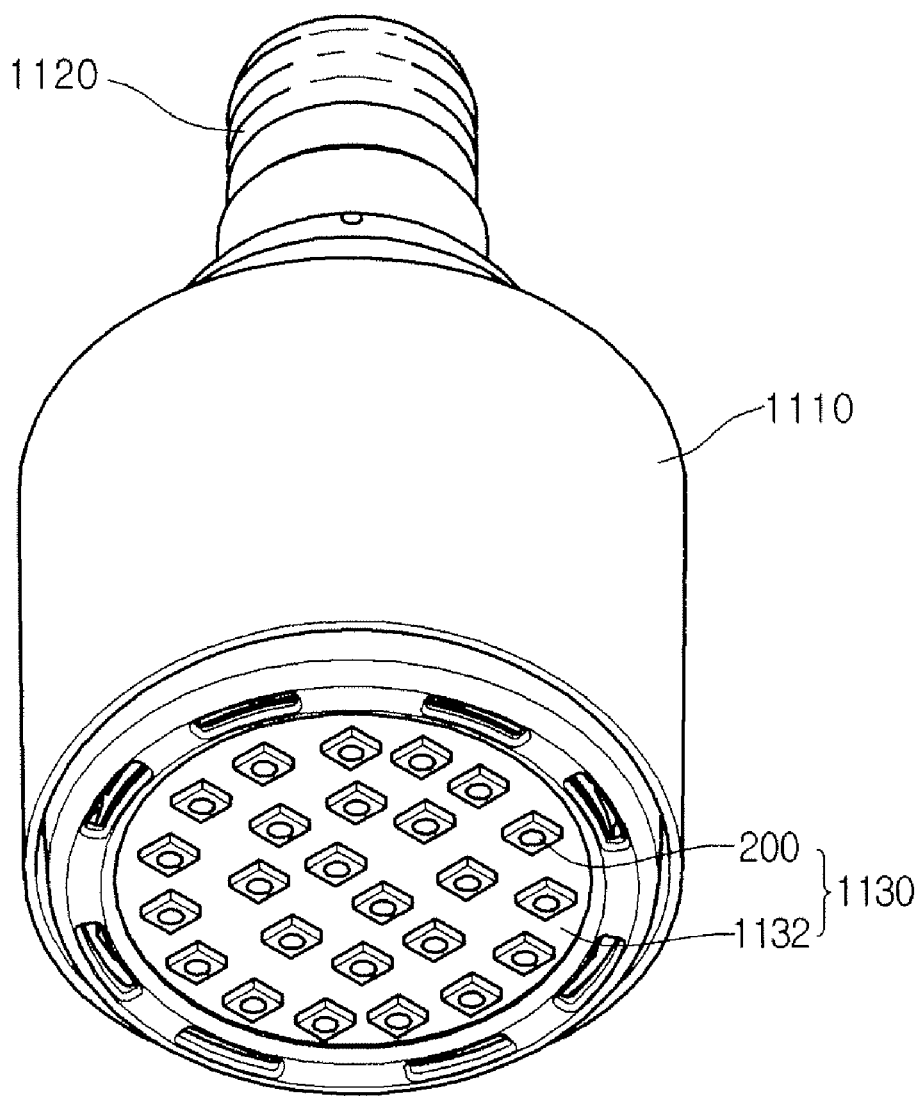

[FIG. 19]
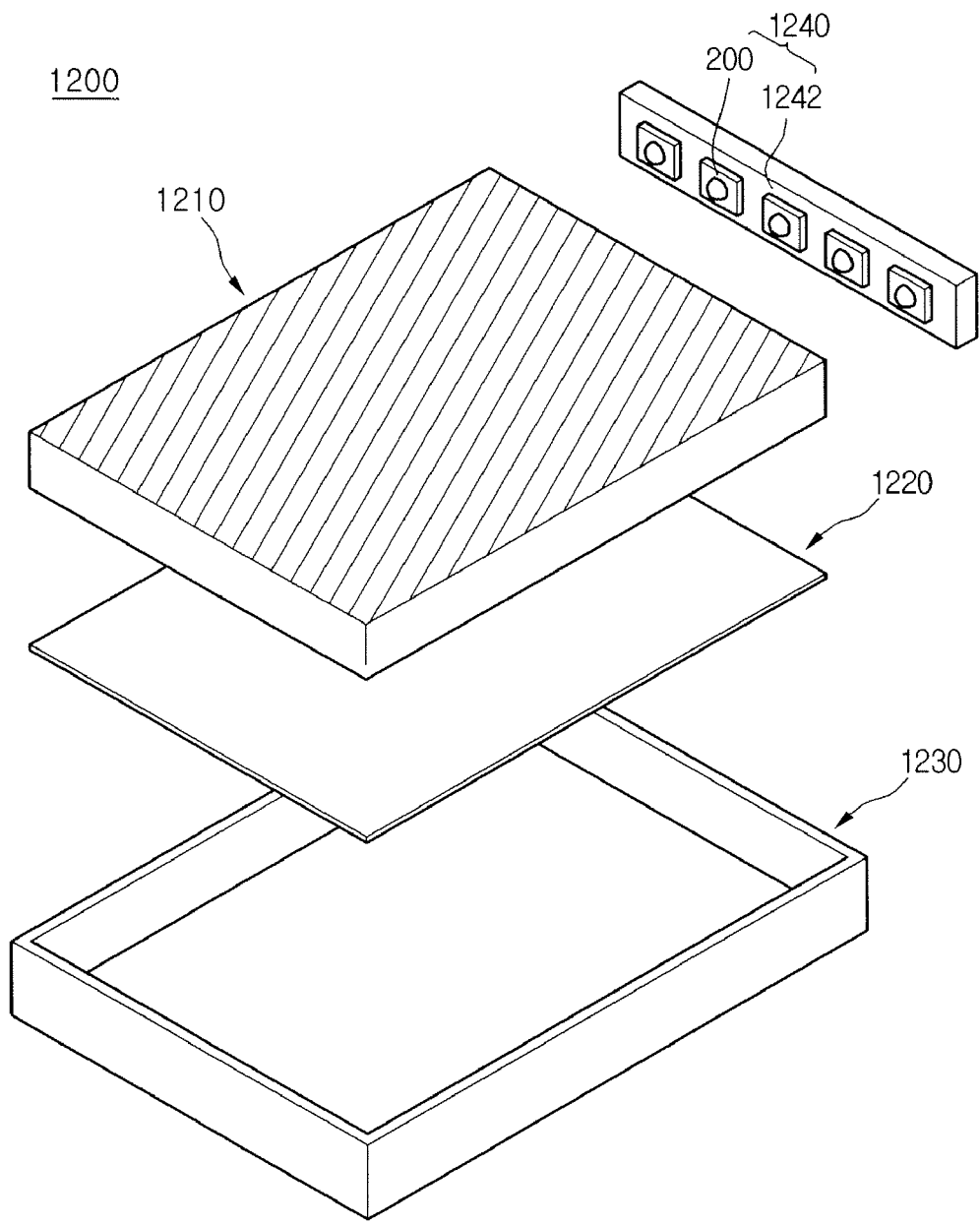

LIGHT EMITTING DEVICE, LIGHT EMITTING DEVICE PACKAGE, AND LIGHTING SYSTEM

CROSS-REFERENCE TO RELATED APPLICATIONS

This application claims under 35 U.S.C. §119 to Korean Patent Application No. 10-2009-0101228 (filed Oct. 23, 2009) and Korean Patent Application No. 10-2010-0013319 (filed Feb. 12, 2010), which are hereby incorporated by reference in their entireties.

BACKGROUND

Embodiments relate to a light emitting device, a light emitting device package, and a lighting system.

In light emitting devices, P-N junction diodes having the properties of converting electrical energy into light energy may be formed by combining group III and V elements on the periodic table. Light emitting devices may implement various colors by controlling the composition ratio of compound semiconductors.

To form a white light emitting device package, light emitting devices of red, green and blue, which are the three primary colors of light, may be combined, or a yellow phosphor such as yttrium aluminum garnet (YAG) and terbium aluminum garnet (TAG) as a phosphor may be added to a blue light emitting device, or a (red/green/blue) three-colored phosphor as a phosphor may be added to a UV light emitting device.

A white light emitting device package including a phosphor may include a light emitting device on the bottom surface of a reflective cup of the package, and the reflective cup may be filled with an encapsulating material mixed with the phosphor. In this case, light having a first wavelength, which is emitted from the light emitting device may be mixed with light having a larger wavelength than the first wavelength, which collides with the phosphor, so as to form white light.

However, since the phosphor is mixed with encapsulating material to fill the reflective cup, it is necessary to provide the reflective cup to the package.

In addition, as the light emitting device comes closer to a phosphor layer, heat generated from the light emitting device is transferred to the phosphor layer to degrade wavelength conversion efficiency of the phosphor layer.

In addition, since phosphor particles sink during a process, concentration of phosphor may vary according to a process time.

In addition, color temperature deviation occurs according to a viewing angle.

In addition, since a yellow phosphor is applied on the outermost part of a blue LED, and light converted in the phosphor is naturally emitted, the light is emitted in all directions. At this point, light re-incident to a light emitting device is absorbed in the light emitting device to cause optical loss, thereby degrading light emitting efficiency.

SUMMARY

Embodiments provide a light emitting device that includes a phosphor layer on a light emitting surface to form white light in the light emitting device, a light emitting device package, and a lighting system.

Embodiments also provide a light emitting device that can suppress transmission of heat generated from the light emitting device to a phosphor layer, a light emitting device package, and a lighting system.

Embodiments also provide a light emitting device that prevents a concentration variation of a phosphor, a light emitting device package, and a lighting system.

Embodiments also provide a light emitting device that prevents color temperature deviation according to a viewing angle, a light emitting device package, and a lighting system.

In one embodiment, a light emitting device includes: a substrate; a light emitting structure on the substrate, the light emitting structure comprising a first conductive type semiconductor layer, a second conductive type semiconductor layer on the first conductive type semiconductor layer, and an active layer between the first and second conductive type semiconductor layers; a first electrode on the light emitting structure; and a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode.

In another embodiment, a light emitting device includes: a substrate; a light emitting structure on the substrate, the light emitting structure comprising a first conductive type semiconductor layer, a second conductive type semiconductor layer on the first conductive type semiconductor layer, and an active layer between the first and second conductive type semiconductor layers; and a patterned phosphor layer on the light emitting structure, wherein the patterned phosphor layer converts light, generated from the light emitting structure, into light having a wavelength longer than that of the light generated from the light emitting structure, and wherein the pattern of the phosphor layer exposes a peripheral portion of the light emitting structure.

In further another embodiment, a light emitting device includes: a substrate; a light emitting structure on the substrate, the light emitting structure comprising a first conductive type semiconductor layer, a second conductive type semiconductor layer on the first conductive type semiconductor layer, and an active layer between the first and second conductive type semiconductor layers; an electrode on the light emitting structure; a light transmitting layer on the light emitting structure and covering the electrode; and a phosphor layer on the light transmitting layer, wherein the light transmitting layer is, in part, positioned between the electrode and the phosphor layer, and wherein the phosphor layer converts light generated from the light emitting structure into light having a wavelength longer than that of the light generated from the light emitting structure.

In still further another embodiment, a light emitting device package includes: a package body; at least one electrode layer on the package body; and a light emitting device electrically connected to the at least one electrode layer, wherein the light emitting device comprises: a substrate, a light emitting structure on the substrate, the light emitting structure comprising a first conductive type semiconductor layer, a second conductive type semiconductor layer on the first conductive type semiconductor layer, and an active layer between the first and second conductive type semiconductor layers, a first electrode on the light emitting structure, and a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode.

In still further another embodiment, a lighting system includes: a light emitting module, wherein the light emitting module comprises: a first substrate; and a light emitting device package on the substrate, wherein the light emitting device package comprises: a package body; at least one electrode layer on the package body; and a light emitting device electrically connected to the at least one electrode layer, wherein the light emitting device comprises: a second substrate, a light emitting structure on the second substrate, the light emitting structure comprising a first conductive type semiconductor layer, a second conductive type semiconductor layer on the first conductive type semiconductor layer, and an active layer between the first and second conductive type semiconductor layers, a first electrode on the light emitting structure, and a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode.

The details of one or more embodiments are set forth in the accompanying drawings and the description below. Other features will be apparent from the description and drawings, and from the claims.

BRIEF DESCRIPTION OF THE DRAWINGS

FIG. 1 is a plan view of a light emitting device according to a first embodiment.

FIG. 2 is a cross-sectional view taken along line A-A' of the light emitting device of FIG. 1.

FIGS. 3 to 6A are cross-sectional views illustrating a method of manufacturing the light emitting device according to the first embodiment.

FIG. 6B is a cross-sectional view illustrating the light emitting device according to the first embodiment.

FIG. 7 is a plan view illustrating a light emitting device according to a second embodiment.

FIG. 8 is a cross-sectional view illustrating the light emitting device according to the second embodiment.

FIG. 9 is a plan view illustrating a light emitting device according to a third embodiment.

FIG. 10 is a cross-sectional view illustrating the light emitting device according to the third embodiment.

FIG. 11 is a plan view illustrating a light emitting device according to a fourth embodiment.

FIG. 12 is a cross-sectional view illustrating the light emitting device according to the fourth embodiment.

FIG. 13 is a plan view illustrating a light emitting device according to a fifth embodiment.

FIG. 14 is a cross-sectional view illustrating the light emitting device according to the fifth embodiment.

FIG. 15 is a cross-sectional view illustrating a light emitting device according to a sixth embodiment.

FIG. 16 is a cross-sectional view illustrating a light emitting device according to a seventh embodiment.

FIG. 17 is a cross-sectional view illustrating a light emitting device package according to an embodiment.

FIG. 18 is a perspective view of a lighting unit according to an embodiment.

FIG. 19 is an exploded perspective view of a backlight unit according to an embodiment.

DETAILED DESCRIPTION OF THE EMBODIMENTS

Hereinafter, a light emitting device, a light emitting device package, and a lighting system will be described with reference to accompanying drawings according to embodiments.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

EMBODIMENTS

FIG. 1 is a plan view of a light emitting device according to a first embodiment. FIG. 2 is a cross-sectional view taken along line A-A' of the light emitting device.

The light emitting device may include a light emitting structure 120 disposed on a second electrode layer 110, a phosphor layer 130 patterned on the light emitting structure 120, and a first electrode 142 on the light emitting structure 120.

In the current embodiment, the light emitting structure 120 is partially exposed through the patterned phosphor layer 130, and the first electrode 142 may be formed on the exposed light emitting structure 120.

The patterned phosphor layer 130 may have an area that ranges from about 30% to 90% of a light emitting area of the light emitting device, but the present disclosure is not limited thereto.

An exposed upper surface of the light emitting device through the patterned phosphor layer 130 may have an area that ranges from about 10% to 70% of the area of the entire upper surface of the light emitting device, but the present disclosure is not limited thereto.

In the first embodiment, the height of the first electrode 142 may be less than that of the patterned phosphor layer 130.

In the first embodiment, the first electrode 142 may be an electrically connected line pattern.

In a method of manufacturing the light emitting device, a light emitting device package, and a lighting system according to the embodiment, the phosphor layer is provided to the light emitting device, so that the light emitting device can form white light.

According to the embodiment, the phosphor layer is patterned on the light emitting device to expose the electrode pattern, and thus, the light emitting area is increased through the patterned phosphor layer to increase the light extraction efficiency.

According to the embodiment, the shape of the phosphor layer is varied to control optical characteristics such as color temperature deviation according to a viewing angle.

Referring to FIGS. 3 to 6A, a method of manufacturing the light emitting device according to the first embodiment will now be described.

A light emitting device according to an embodiment may be formed of a material such as GaN, GaAs, GaAsP, or GaP. For example, a Green-Blue LED may be formed of GaN (InGaN), and a Yellow~Red LED may be formed of InGaAIP or AIGaAs. Full color light may be emitted by varying the composition of a material.

Referring to FIG. 3, the light emitting device may include the light emitting structure 120 disposed on the second electrode layer 110.

Hereinafter, a method of manufacturing the light emitting structure 120 disposed on the second electrode layer 110 will now be described.

First, a first substrate (not shown) is prepared. The first substrate includes a conductive surface or a dielectric substrate. For example, the first substrate includes at least one of sapphire ($Al_2O_3$), SiC, Si, GaAs, GaN, ZnO, Si, GaP, InP, Ge, and $Ga_2O_3$. Impurities may be removed from the surface of the first substrate by using wet washing.

Thereafter, the light emitting structure 120, which includes a first conductive type semiconductor layer 122, an active layer 124, and a second conductive type semiconductor layer 126, may be formed on the first substrate.

The light emitting structure 120 may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HYPE), but the present disclosure is not limited thereto.

The first conductive type semiconductor layer 122 may be formed of group III-V compound semiconductor that is doped with a first conductive type dopant. When the first conductive type semiconductor layer 122 is an N type semiconductor layer, the first conductive type dopant may include Si, Ge, Sn, Se, or Te as an N type dopant, but the present disclosure is not limited thereto.

The first conductive type semiconductor layer 122 may include a semiconductor material having a composition equation of $In_xAl_yGa_{1-x-y}N$ ($0 \leq x \leq 1$, $0 \leq y \leq 1$, $0 \leq x+y \leq 1$).

The first conductive type semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may have at least one of a single quantum well structure, a multi quantum well (MQW) structure, a quantum-wire structure, and a quantum dot structure. For example, the active layer 124 may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 124 may have a pair structure with at least one of InGaN/GaN, InGaN/InGaN, AlGaN/GaN, InAlGaN/GaN, GaAs/AlGaAs(InGaAs), and GaP/AlGaP(InGaP), but the present disclosure is not limited thereto. The well layer may be formed of a material having a lower band gap than that of the barrier layer.

A conductive type clad layer may be formed on at least one of the upper and lower sides of the active layer 124, and may be formed of AlGaN based semiconductor, and may have a higher band gap than that of the active layer 124.

The second conductive type semiconductor layer 126 may include group III-V compound semiconductor that is doped with a second conductive type dopant, e.g., include a semiconductor material having a composition equation of $In_xAl_yGa_{1-x-y}N$ ($0 \leq x \leq 1$, $0 \leq y \leq 1$, $0 \leq x+y \leq 1$). For example, the second conductive type semiconductor layer 126 may include GaN, AlN, AlGaN, InGaN, InN, InAlGaN, AlInN, AlGaAs, GaP, GaAs, GaAsP, or AlGaInP. When the second conductive type semiconductor layer 126 is a P type semiconductor layer, the second conductive type dopant may include Mg, Zn, Ca, Sr, or Ba as a P type dopant. The second conductive type semiconductor layer 126 may be a single layer or a multi layer, but the present disclosure is not limited thereto.

The second conductive type semiconductor layer 126 may be formed as a p type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium ($EtCp_2Mg$) {$Mg(C_2H_5C_5H_4)_2$} including p type impurities such as magnesium (Mg) into a chamber, but the present disclosure is not limited thereto.

In the embodiment, the first conductive type semiconductor layer 122 is an N type semiconductor layer, and the second conductive type semiconductor layer 126 is a P type semiconductor layer, but the present disclosure is not limited thereto. A layer of an opposite conductive type semiconductor to the second conductive type semiconductor, e.g., of an N type semiconductor layer (not shown) may be formed on the second conductive type semiconductor layer 126. Accordingly, the light emitting structure 120 may have one of an N-P junction structure, a P-N junction structure, an N-P-N junction structure and a P-N-P junction structure.

Thereafter, the second electrode layer 110 is formed on the second conductive type semiconductor layer 126.

The second electrode layer 110 may include an ohmic layer (not shown), a reflective layer (not shown), an adhesive layer (not shown), and a conductive support layer (not shown).

For example, the second electrode layer 110 may include an ohmic layer (not shown) that is in ohmic-contact with the light emitting structure 120 to efficiently supply power to the light emitting structure 120 and may be formed by stacking a single metal or a metal alloy, and a metal oxide in multi layers.

For example, the ohmic layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but the present disclosure is not limited thereto.

The second electrode layer 110 includes a reflective layer (not shown) to reflect light incident from the light emitting structure 120, thereby improving the light extraction efficiency.

For example, the reflective layer may be formed of a metal or an alloy including at least one of Ag, Ni, Al, Rh, Pd, Ir, Ru, Mg, Zn, Pt, Au, Hf. In addition, the reflective layer may be formed of the metal or alloy, and a light transmitting conductive material such as IZO, IZTO, IAZO, IGZO, IGTO, AZO, and ATO in multi layers, for example, may be stacked in IZO/Ni, AZO/Ag, IZO/Ag/Ni, or AZO/Ag/Ni.

When the second electrode layer 110 includes an adhesive layer (not shown), the reflective layer may function as an adhesive layer, or include a barrier metal or a bonding metal. For example, the adhesive layer may include at least one of Ti, Au, Sn, Ni, Cr, Ga, In, Bi, Cu, Ag and Ta.

The second electrode layer 110 may include a conductive support substrate (not shown). The conductive support substrate supports the light emitting structure 120, and may provide power to the light emitting structure 120. The conductive support substrate may be formed of a metal, a metal alloy, or a conductive semiconductor material, which has high electric conductivity.

For example, the conductive support substrate may include at least one of copper (Cu), copper alloy, gold (Au), nickel (Ni), molybdenum (Mo), copper-tungsten (Cu—W), and a carrier wafer (e.g., Si, Ge, GaAs, GaN, ZnO, SiGe, and SiC).

The thickness of the conductive support substrate may be varied according to the design of the light emitting device, and may range, for example, from about 30 μm to 500 μm.

Methods of forming the conductive support substrate may include an electrochemical metal deposition method, a plating method, and a bonding method using a eutectic metal.

Thereafter, the first substrate is removed to expose the first conductive type semiconductor layer 122. The first substrate may be removed using a method such as laser lift off or chemical lift off. Alternatively, the first substrate may be removed using physical grinding.

Accordingly, the light emitting structure 120 may be formed on the second electrode layer 110 illustrated in FIG. 2.

After the first substrate is removed, an etching process may be performed on the light emitting structure 120 to form an inclined side wall of the light emitting structure 120, but the present disclosure is not limited thereto.

Next, a phosphor layer 130a is formed on the light emitting structure 120 as illustrated in FIG. 3.

The phosphor layer 130a may be formed of an encapsulating material including a phosphor to protect a chip and increase the light extraction efficiency.

The encapsulating material may be an epoxy encapsulating material or a silicon encapsulating material, but the present disclosure is not limited thereto.

The phosphor may include a host material and an active material. For example, yttrium aluminum garnet (YAG) as a host material and a cerium (Ce) active material, or a silicate based host material and a europium (Eu) active material may be used, but the present disclosure is not limited thereto.

Encapsulating method using the encapsulating material include methods such as dispensing, casting molding, transfer molding, vacuum printing, screen printing.

Next, a mask pattern 190 is formed on the phosphor layer 130a. For example, a photosensitive pattern exposing a portion of the phosphor layer 130a to be removed may be used as the mask pattern 190.

Next, referring to FIG. 4, the phosphor layer 130a is partially etched using the mask pattern 190 as an etching mask to partially expose the light emitting structure 120.

Next, referring to FIG. 5, the first electrode 142 is formed on the light emitting structure 120. For example, a conductive metal may be used to form the first electrode 142. A first electrode material 144 may be formed on the mask pattern 190. The first electrode material 144 and the first electrode 142 may achieve a bridge therebetween. The mask pattern 190 may expose the light emitting structure 120 in a region in which pad electrodes 145 are formed, and the pad electrodes 145 may be formed together with the first electrode 142, but the present disclosure is not limited thereto.

In the current embodiment, the light emitting device is exemplified as a vertical light emitting device, and the number of the pad electrodes 145 is two, but may be one or more. For example, the pad electrodes 145 provided in plurality to a vertical light emitting device may be applied to a large capacity light emitting device.

Referring to FIG. 6A, a lift off process removing the mask pattern 190 is performed to complete the patterned phosphor layer 130 and the first electrode 142.

In the current embodiment, the first electrode 142 may be formed first, and then, the phosphor layer 130 may be formed using the lift off process.

For example, the first electrode 142 may be patterned first on the light emitting structure 120, and a second mask pattern (not shown) may be formed on the first electrode 142, and then, filled flatly with the phosphor layer 130 to correspond to the height of the second mask pattern, and be cured. Thereafter, the second mask pattern may be removed to complete the phosphor layer 130.

In the first embodiment, the light emitting structure 120 is partially exposed through the patterned phosphor layer 130, and the first electrode 142 may be formed on the light emitting structure 120.

In the first embodiment, the height of the first electrode 142 is less than the height of the phosphor layer 130 to minimize blocking of emitted light In the first embodiment, the first electrode 142 may be an electrically connected line pattern for current spreading, but the present disclosure is not limited thereto.

FIG. 6B is a cross-sectional view illustrating the light emitting device according to the first embodiment.

Referring to FIG. 6B, a phosphor layer 132 may be formed even on a side surface of the light emitting structure 120. Accordingly, light emitted to the side surface of the light emitting structure 120 may be white. The phosphor layer 132 may be formed on just a portion of the side surface instead of covering the entire side surface of the light emitting structure 120, so that the thickness of the phosphor layer 132 formed on the side surface is adjusted to control the color temperature of the light emitting device.

In the light emitting device, the light emitting device package, and the method of manufacturing the light emitting device according to the embodiment, the phosphor layer is provided to the light emitting device, so that the light emitting device may form white light.

According to the embodiment, the phosphor layer is patterned on the light emitting device to expose the electrode pattern, and thus, the light emitting area is increased through the patterned phosphor layer to increase the light extraction efficiency.

According to the embodiment, the shape of the phosphor layer is varied to control optical characteristics such as color temperature deviation according to a viewing angle.

FIG. 7 is a plan view of a light emitting device according to a second embodiment. FIG. 8 is a cross-sectional view taken along line B-B' of the light emitting device.

The second embodiment may use the technical characteristics of the first embodiment, and the main characteristics of the second embodiment will be described principally.

The light emitting device may include a light emitting structure 220 disposed on a second electrode 210, a phosphor layer 130 patterned on the light emitting structure 220, and a first electrode 242 on the light emitting structure 220, and pad electrodes 245.

The light emitting structure 220 may include a first conductive type semiconductor layer (not shown), an active layer (not shown), and a second conductive type semiconductor layer (not shown) on a first substrate (not shown).

The second electrode 210 may include an ohmic layer (not shown), a reflective layer (not shown), a coupling layer (not shown), and a second substrate (not shown).

In the second embodiment, an upper surface of the light emitting structure 220 exposed through the patterned phosphor layer 230 may be circular. Accordingly, an exposed area of the light emitting structure 220 and an unexposed area thereof may be adjusted to control optical characteristics such as color temperature deviation according to a viewing angle. The light emitting area is increased through the patterned phosphor layer 230 to increase the light extraction efficiency.

In the light emitting device, a light emitting device package, and a method of manufacturing the light emitting device according to the second embodiment, the phosphor layer is provided to the light emitting device, so that the light emitting device may form white light.

FIG. 9 is a plan view of a light emitting device according to a third embodiment. FIG. 10 is a cross-sectional view taken along line C-C' of the light emitting device.

The light emitting device may include a light emitting structure 320 disposed on a second electrode 310, a phosphor layer 330 patterned on the light emitting structure 320, and a first electrode 342 on the light emitting structure 320, and pad electrodes 345.

The light emitting structure 320 may include a first conductive type semiconductor layer (not shown), an active layer (not shown), and a second conductive type semiconductor layer (not shown) on a first substrate (not shown). The second electrode 310 may include an ohmic layer (not shown), a reflective layer (not shown), a coupling layer (not shown), and a second substrate (not shown).

In the third embodiment, the patterned phosphor layer 330 may be patterned circular. Accordingly, the patterned phosphor layer 330 has a large surface area that emitted light contacts, and thus, a light emitting area is increased to increase the light extraction efficiency. In addition, an exposed area of the light emitting structure 320 and an unexposed area thereof may be adjusted to control optical characteristics such as color temperature deviation according to a viewing angle.

In the light emitting device, a light emitting device package, and a method of manufacturing the light emitting device according to the third embodiment, the phosphor layer is provided to the light emitting device, so that the light emitting device may form white light.

FIG. 11 is a plan view of a light emitting device according to a fourth embodiment. FIG. 12 is a cross-sectional view taken along line D-D' of the light emitting device.

The light emitting device may include a light emitting structure 420 disposed on a second electrode 410, a phosphor layer 430 patterned on the light emitting structure 420, and a first electrode 442 on the light emitting structure 420, and pad electrodes 445.

The light emitting structure 420 may include a first conductive type semiconductor layer (not shown), an active layer (not shown), and a second conductive type semiconductor layer (not shown) on a first substrate (not shown).

The second electrode 410 may include an ohmic layer (not shown), a reflective layer (not shown), a coupling layer (not shown), and a second substrate (not shown).

In the fourth embodiment, the phosphor layer 430 has a patterned side wall, for example, a patterning process is performed on the edge of the phosphor layer 430 to form a concavo-convex surface. Accordingly, as the side surface area of the phosphor layer 430 is increased, a light extraction area is increased, and a light emitting area of the phosphor layer 430 is increased, thereby increasing the light extraction efficiency.

In the light emitting device, a light emitting device package, and a method of manufacturing the light emitting device according to the third embodiment, the phosphor layer is provided to the light emitting device, so that the light emitting device may form white light.

FIG. 13 is a plan view of a light emitting device according to a fifth embodiment. FIG. 14 is a cross-sectional view taken along line E-E' of the light emitting device.

The light emitting device may include a light emitting structure 520, a light transmitting layer 550 disposed on the light emitting structure 520, and a phosphor layer 530 disposed on the light transmitting layer 550.

In the light emitting device, the phosphor layer 530 is provided to the light emitting device, so that the light emitting device may form white light.

According to the embodiment, the light transmitting layer 550 having low heat conductivity and light transmitting property is inserted between a light emitting surface of the light emitting device and the phosphor layer 530 to prevent transmission of heat generated from a light emitting surface of the light emitting structure 520 to the phosphor layer 530, thereby increasing wavelength conversion efficiency of a phosphor.

The light transmitting layer 550 may be formed of silicon gel, but the present disclosure is not limited thereto.

The light transmitting layer 550 may have a thickness ranging from about 2 to 200 μm, but the present disclosure is not limited thereto. The light transmitting layer 550 may be thicker than a first electrode 542 on the light emitting structure 520, for example, may have a thickness of about 2 μm or greater, but the present disclosure is not limited thereto. The light transmitting layer 550 may have a height that is half or less the entire height of the light emitting device, for example, a height of 200 μm or less, but the present disclosure is not limited thereto.

The phosphor layer 530 may have a thickness ranging from about 5 to 500 μm, but the present disclosure is not limited thereto. The phosphor layer 530 may have a thickness in a range in which a wavelength conversion from blue light to yellow light can be made, for example, a thickness of about 5 μm or greater, and have a thickness of about 500 μm or less considering the size of the light emitting device, but the present disclosure is not limited thereto.

In the embodiment, the first electrode 542 may be an electrically connected line pattern for current spreading, and a portion of the first electrode 542 may be electrically connected to the exposed pad electrodes 545.

In the light emitting device, the phosphor layer is provided to the light emitting device, so that the light emitting device may form white light.

According to the embodiment, transmission of heat generated from the light emitting device to the phosphor layer is prevented to increase wavelength conversion efficiency of the phosphor layer.

Hereinafter, a method of manufacturing the light emitting device according to the fifth embodiment will now be described with reference to FIGS. 13 and 14.

First, the light emitting device of the fifth embodiment may include the light emitting structure 520 disposed on a second electrode 510. The second electrode 510 may include at least one of an ohmic layer, a reflective layer, a coupling layer, and a conductive substrate.

As in the first embodiment, the light emitting structure 520 may include a first conductive type semiconductor layer (not shown), an active layer (not shown), and a second conductive type semiconductor layer (not shown).

Next, the first electrode 542 may be formed on the light emitting structure 520. The first electrode 542 may be an electrically connected line pattern. The first electrode 542 may be electrically connected to the pad electrodes 545.

Next, the light transmitting layer 550 is formed on the light emitting structure 520.

For example, a first pattern (not shown) is formed on a side surface of the light emitting structure 520, and may be used as a barrier to form the light transmitting layer 550.

The light transmitting layer 550 may have a thickness ranging from about 2 to 200 μm, but the present disclosure is not limited thereto. The light transmitting layer 550 may be thicker than the first electrode 542 on the light emitting structure 520, for example, may have a thickness of about 2 μm or greater, but the present disclosure is not limited thereto. The light transmitting layer 550 may have a height that is half or less the entire height of the light emitting device, for example, a height of 200 μm or less, but the present disclosure is not limited thereto.

The light transmitting layer 550 may be formed of silicon gel, but the present disclosure is not limited thereto.

According to the embodiment, the light transmitting layer 550 having low heat conductivity and light transmitting property is inserted between the light emitting surface of the light emitting device and the phosphor layer 530 to prevent transmission of heat generated from the light emitting surface of the light emitting structure 520 to the phosphor layer 530, thereby increasing wavelength conversion efficiency of the phosphor.

Next, the first pattern is removed, and the second pattern (not shown) is formed, and then, the second pattern is used as a barrier to form the phosphor layer 530 on the light transmitting layer 550.

The phosphor layer 530 may have a thickness ranging from about 5 to 500 μm, but the present disclosure is not limited thereto. The phosphor layer 530 may have a thickness in a range in which a wavelength conversion from blue light to yellow light can be made, for example, a thickness of about 5 μm or greater, and have a thickness of about 500 μm or less considering the size of the light emitting device, but the present disclosure is not limited thereto.

The phosphor layer 530 may be formed of an encapsulating material including a phosphor to protect a chip and increase the light extraction efficiency.

The encapsulating material may be an epoxy encapsulating material or a silicon encapsulating material, but the present disclosure is not limited thereto.

The phosphor may include a host material and an active material. For example, yttrium aluminum garnet (YAG) as a host material and a cerium (Ce) active material, or a silicate based host material and a europium (Eu) active material may be used, but the present disclosure is not limited thereto.

Next, the second pattern may be removed to complete the light emitting device according to the fifth embodiment.

In the light emitting device, the phosphor layer is provided to the light emitting device, so that the light emitting device may form white light.

According to the fifth embodiment, the light transmitting layer suppresses transmission of heat generated from the light emitting device to the phosphor layer to increase wavelength conversion efficiency of the phosphor layer.

FIG. 15 is a cross-sectional view illustrating a light emitting device according to a sixth embodiment.

The sixth embodiment may use the technical characteristics of the first to fifth embodiments.

In the sixth embodiment, the phosphor layer 530 may include a first phosphor layer 531 disposed on the light transmitting layer 550, and a second phosphor layer 532 disposed on at least one portion of the side surface of the light emitting structure 520. The second phosphor layer 532 disposed entirely on the side surface of the light emitting structure 520 is exemplified, but the present disclosure is not limited thereto.

The sixth embodiment may be applied to the first to fourth embodiments. For example, in the first to fourth embodiments, the phosphor layer may include a first phosphor layer (not shown) disposed on the upper surface of the light emitting structure, and a second phosphor layer (not shown) disposed on at least one portion of the side surface of the light emitting structure.

In the sixth embodiment, the phosphor layer 530 may be formed by forming the light transmitting layer 550, and then, by forming as a barrier a third pattern (not shown) spaced apart from the light transmitting layer 550, but the present disclosure is not limited thereto.

According to the sixth embodiment, a rate of blue light emitted from the light emitting surface of the light emitting device and extracted through the side surface of the light transmitting layer may be adjusted to control optical characteristics such as color temperature deviation according to a viewing angle.

For example, the first phosphor layer 531 may have a first thickness T1, and the second phosphor layer 532 may have a second thickness T2.

The second thickness T2 may be half or less the first thickness T1. The second thickness T2 is less than the first thickness T1 in FIG. 15, but the present disclosure is not limited thereto, and thus, the second thickness T2 may have a range of $0 < T2 \leq 2T1$.

According to the sixth embodiment, the second thickness T2 of the second phosphor layer 532 is adjusted to control a rate of light extracted through the side surface of the light transmitting layer, thereby controlling optical characteristics such as color temperature deviation according to a viewing angle.

In addition, a rate of light extracted through the side surface of the light emitting structure 520 is adjusted according to a rate of the second phosphor layer 532 formed on the side surface of the light emitting structure 520, thereby controlling optical characteristics such as color temperature deviation according to a viewing angle.

FIG. 16 is a cross-sectional view illustrating a light emitting device according to a seventh embodiment.

The seventh embodiment may use the technical characteristics of the fifth and sixth embodiments.

The light emitting device according to the seventh embodiment may be formed by patterning the phosphor layer 535.

As in the fifth embodiment, in the seventh embodiment, the phosphor layer may be formed by forming a raw phosphor layer, and then, by performing a predetermined patterning process on the raw phosphor, or the phosphor layer may be formed by forming a fourth pattern (not shown), and then, by lifting off the fourth pattern, but the present disclosure is not limited thereto.

According to the seventh embodiment, since the patterned phosphor layer 535 is formed on the light emitting device, a light extraction area through the patterned phosphor layer is increased to improve the light extraction efficiency.

In the seventh embodiment, the light transmitting layer 550 is also patterned to expose a portion of the first electrode 542 as illustrated in FIG. 16, but the present disclosure is not limited thereto, and thus, only the phosphor layer 535 may be patterned.

The patterned phosphor layer 535 may be formed even on the side surface of the light emitting structure 520, and thus, light emitted through the side surface of the light emitting structure 520 may be emitted as white light. Instead of covering the entire side surface of the light emitting structure 520, the patterned phosphor layer 535 may be formed on a portion thereof. Thus, the thickness of the patterned phosphor layer 535 disposed on the side surface is adjusted to control the color temperature of the light emitting device.

In the light emitting device, the phosphor layer is provided to the light emitting device, so that the light emitting device may form white light.

According to the embodiment, the light transmitting layer suppresses transmission of heat generated from the light emitting device to the phosphor layer to increase wavelength conversion efficiency of the phosphor layer.

According to the embodiment, the shape of the phosphor layer is varied to control optical characteristics such as color temperature deviation according to a viewing angle.

According to the embodiment, the phosphor layer is patterned on the light emitting device to increase the light extraction efficiency.

FIG. 17 is a cross-sectional view of a light emitting device package 200 including a light emitting device according to an embodiment.

A light emitting device package 200 according to an embodiment includes a body 610, a third electrode layer 630 and a fourth electrode layer 640 disposed in the body 610, an light emitting device 100 disposed in the body 610 and electrically connected to the third electrode layer 630 and the fourth electrode layer 640, and a molding member 670 surrounding the light emitting device 100.

The body 610 may be formed of a silicon material, a synthetic resin material, or a metal material. An inclined surface may be disposed around the light emitting device 100.

The third electrode layer 630 and the fourth electrode layer 640 are electrically separated from each other and supply a power to the light emitting device 100. Also, the third electrode layer 630 and the fourth electrode layer 640 may reflect light generated in the light emitting device 100 to improve light efficiency. In addition, the third electrode layer 211 and the fourth electrode layer 212 may release heat generated in the light emitting device 100 to the outside.

The light emitting device 100 may be the light emitting device exemplified in the first to seventh embodiments. Although the light emitting device 100 is exemplified as a vertical chip, the light emitting device 100 may be a horizontal chip.

The light emitting device 100 may be disposed on the body 610 or on the third electrode layer 630 or the fourth electrode layer 640.

The light emitting device 100 may be electrically connected to the third electrode layer 630 and/or the fourth electrode layer 640 through a wire 660. In FIG. 21, one wire 660 may be used as an example, but are not limited thereto.

The molding member 670 may surround the light emitting device 100 to protect the light emitting device 100.

In the light emitting device, the light emitting device package, and a method of manufacturing the light emitting device according to the embodiment, a phosphor layer is provided to the light emitting device, so that the light emitting device may form white light.

According to the embodiment, transmission of heat generated from the light emitting device to the phosphor layer is suppressed to increase wavelength conversion efficiency of the phosphor layer.

According to the embodiment, the shape of the phosphor layer is varied to control optical characteristics such as color temperature deviation according to a viewing angle.

According to the embodiment, the phosphor layer is patterned on the light emitting device to increase the light extraction efficiency.

The light emitting device package 200 according to an embodiment may be applicable to a lighting system. The lighting system may include a lighting unit illustrated in FIG. 18 and a backlight unit illustrated in FIG. 19. In addition, the lighting system may include traffic lights, a vehicle headlight, and a sign.

FIG. 18 is a perspective view of a lighting unit 1100 according to an embodiment.

Referring to FIG. 18, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one LIGHT EMITTING DEVICE package 1210 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 1210 may be mounted on the substrate 1132. The light emitting device package 1210 may include at least one light emitting diode (LED) 100. The light emitting diode 100 may include a colored light emitting diode that emits red, green, blue, or white light, and an UV light emitting diode that emits ultraviolet (UV) light.

The light emitting module 1130 may include a plurality of light emitting device packages 1210 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. As shown in FIG. 18, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

FIG. 19 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may contact at least one surface of the light guide plate 1210 to provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of LIGHT EMITTING DEVICE packages 200 mounted on the substrate 1242. The substrate 1242 may contact the light guide plate 1210, but is not limited thereto.

A surface of the substrate 1242 may contact the light guide plate 1210. Since the substrate 1242 may have a substantially uniform thickness over the entire region, the entire region can contact the light guide plate 1210.

The substrate 1242 may be a PCB including a circuit pattern (not shown). However, the substrate 1242 may include a metal core PCB or a flexible PCB as well as the PCB, but is not limited thereto.

Since the plurality of light emitting device packages 200 may be inserted into a plurality of through holes provided to the substrate 1242, each light emitting surface thereof may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

As described above, the lighting system according to the embodiments includes the light emitting device packages according to the embodiments, thereby improving reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting structure on the substrate, the light emitting structure comprising a first conductive type semiconductor layer, a second conductive type semiconductor layer on the first conductive type semiconductor layer, and an active layer between the first and second conductive type semiconductor layers;
   a first electrode on the light emitting structure; and
   a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode,
   wherein the light emitting structure is directly disposed on the substrate, and
   wherein the patterned phosphor layer is disposed only on an upper surface of the light emitting structure.

2. The light emitting device of claim 1, wherein the pattern of the phosphor layer provides a plurality of openings in the phosphor layer through which the first electrode is exposed.

3. The light emitting device of claim 1, wherein the pattern of the phosphor layer exposes a portion of the upper surface of the light emitting structure.

4. The light emitting device of claim 3, wherein the pattern of the phosphor layer provides an opening through which the first electrode and the portion of the light emitting structure are exposed, and wherein the opening has a predetermined shape.

5. The light emitting device of claim 4, wherein the opening has a circular shape.

6. The light emitting device of claim 3, wherein the patterned phosphor layer covers a portion of the first electrode.

7. The light emitting device of claim 3, wherein the pattern of the phosphor layer exposes a peripheral portion of the upper surface of the light emitting structure and covers a central portion of the light emitting structure.

8. The light emitting device of claim 1 further comprising a light transmitting layer, and wherein the patterned phosphor layer comprises:
   a first portion on the light transmitting layer, and
   a second portion on a peripheral portion of the light emitting structure.

9. The light emitting device of claim 8, wherein the first portion of the patterned phosphor layer has a first width and the second portion of the patterned phosphor layer has a second width, and wherein the second width is, at most, half the first width.

10. A light emitting device comprising:
    a substrate;
    a light emitting structure on the substrate, the light emitting structure comprising a first conductive type semiconductor layer, a second conductive type semiconductor layer on the first conductive type semiconductor layer, and an active layer between the first and second conductive type semiconductor layers; and
    a patterned phosphor layer on the light emitting structure, wherein the patterned phosphor layer converts light, generated from the light emitting structure, into light having a wavelength longer than that of the light generated from the light emitting structure, and wherein the pattern of the phosphor layer exposes a peripheral portion of the light emitting structure,
    wherein the light emitting structure is directly disposed on the substrate, and
    wherein the patterned phosphor layer is disposed only on an upper surface of the light emitting structure.

11. The light emitting device of claim 10, further comprising a light transmitting layer, and wherein the patterned phosphor layer comprises:
    a first portion on the light transmitting layer, and
    a second portion on part of the peripheral portion of the light emitting structure.

12. The light emitting device of claim 11, wherein the first portion of the patterned phosphor layer has a first width and the second portion of the patterned phosphor layer has a second width, and wherein the second width is, at most, half the first width.

13. The light emitting device of claim 10, further comprising an electrode on the light emitting structure, wherein the pattern of the phosphor layer exposes at least a portion of the electrode.

14. A light emitting device comprising:
a substrate;
a light emitting structure on the substrate, the light emitting structure comprising a first conductive type semiconductor layer, a second conductive type semiconductor layer on the first conductive type semiconductor layer, and an active layer between the first and second conductive type semiconductor layers;
an electrode on the light emitting structure;
a light transmitting layer on the light emitting structure and covering the electrode; and
a patterned phosphor layer on the light transmitting layer, wherein the light transmitting layer is, in part, positioned between the light emitting structure and the patterned phosphor layer, and wherein the patterned phosphor layer converts light generated from the light emitting structure into light having a wavelength longer than that of the light generated from the light emitting structure,
wherein the light emitting structure is directly disposed on the substrate, and
wherein the patterned phosphor layer is disposed only on an upper surface of the light emitting structure.

15. The light emitting device of claim 14, wherein the light transmitting layer encapsulates the electrode.

16. The light emitting device of claim 14, wherein the patterned phosphor layer comprises:
a first portion on the light transmitting layer, and
a second portion on a peripheral portion of the light emitting structure.

17. The light emitting device of claim 16, wherein the first portion of the patterned phosphor layer has a first width and the second portion of the phosphor layer has a second width, and wherein the second width is, at most, half the first width.

18. A light emitting device package comprising:
a package body;
at least one electrode layer on the package body; and
a light emitting device electrically connected to the at least one electrode layer, wherein the light emitting device comprises:
a substrate,
a light emitting structure on the substrate, the light emitting structure comprising a first conductive type semiconductor layer, a second conductive type semiconductor layer on the first conductive type semiconductor layer, and an active layer between the first and second conductive type semiconductor layers,
a first electrode on the light emitting structure, and
a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode, wherein the light emitting structure is directly disposed on the substrate, and
wherein the patterned phosphor layer is disposed only on an upper surface of the light emitting structure.

19. A lighting system comprising a light emitting module, wherein the light emitting module comprises:
a first substrate; and
a light emitting device package on the substrate, wherein the light emitting device package comprises:
a package body;
at least one electrode layer on the package body; and
a light emitting device electrically connected to the at least one electrode layer, wherein the light emitting device comprises:
a second substrate,
a light emitting structure on the second substrate, the light emitting structure comprising a first conductive type semiconductor layer, a second conductive type semiconductor layer on the first conductive type semiconductor layer, and an active layer between the first and second conductive type semiconductor layers,
a first electrode on the light emitting structure, and
a patterned phosphor layer on the light emitting structure, wherein the patterned phosphor layer converts light generated from the light emitting structure into light having a wavelength longer than that of the light generated from the light emitting structure, and wherein the pattern of the phosphor layer exposes the first electrode, wherein the light emitting structure is directly disposed on the substrate, and
wherein the patterned phosphor layer is disposed only on an upper surface of the light emitting structure.

20. The light emitting device of claim 1, wherein the light emitting structure is directly physically contacted with the substrate.

21. The light emitting device of claim 20, wherein the second conductive type semiconductor layer of the light emitting structure is directly physically contacted with the substrate.

22. The light emitting device of claim 1, wherein the substrate comprises a second electrode layer on a bottom side of the light emitting structure,
wherein the second electrode layer is directly physically contacted with the bottom side of the light emitting structure,
and the first electrode is directly physically contacted with a upper side of the light emitting structure.

23. The light emitting device of claim 1, wherein the phosphor layer has a thickness ranging from about 5 to 500 μm.

24. The light emitting device of claim 1, wherein the phosphor layer comprises a substantially flat surface.

* * * * *